US007842548B2

(12) United States Patent
Lee et al.

(10) Patent No.: US 7,842,548 B2
(45) Date of Patent: Nov. 30, 2010

(54) FIXTURE FOR P-THROUGH SILICON VIA ASSEMBLY

(75) Inventors: Chien-Hsiun Lee, Hsin-Chu (TW); Chen-Shien Chen, Zhubei (TW); Mirng-Ji Lii, Sinpu Township, Hsinchu County (TW); Tjandra Winata Karta, Hsin-Chu County (TW)

(73) Assignee: Taiwan Semconductor Manufacturing Co., Ltd., Hsin-Chu (TW)

( * ) Notice: Subject to any disclaimer, the term of this patent is extended or adjusted under 35 U.S.C. 154(b) by 316 days.

(21) Appl. No.: 12/107,504

(22) Filed: Apr. 22, 2008

(65) Prior Publication Data

US 2009/0263214 A1 Oct. 22, 2009

(51) Int. Cl.
*H01L 21/58* (2006.01)

(52) U.S. Cl. ....................... 438/108; 438/458; 438/459; 257/E21.516

(58) Field of Classification Search ........... 257/E21.516
See application file for complete search history.

(56) References Cited

U.S. PATENT DOCUMENTS 5,480,842 A * 1/1996 Clifton et al. ............... 438/464
5,753,070 A 5/1998 Dandia
6,461,942 B2 * 10/2002 Watanabe et al. ........... 438/464
6,827,636 B2 * 12/2004 Yamada ....................... 451/65
6,924,551 B2 8/2005 Rumer et al.
7,196,407 B2 3/2007 Takahashi
7,205,638 B2 4/2007 Figueroa et al.
7,601,615 B2 * 10/2009 Hayashi et al. ............. 438/459
2005/0153525 A1 * 7/2005 Liu ........................... 438/463
2008/0274592 A1 * 11/2008 Lee et al. .................... 438/113

* cited by examiner

*Primary Examiner*—Stephen W Smoot
(74) *Attorney, Agent, or Firm*—Duane Morris LLP

(57) ABSTRACT

A silicon-based wafer such as a TSV interposer wafer having a first and second surfaces wherein a glass carrier is mounted on the second surface by a UV tape is held by a vacuum holder applied on the first surface and the glass carrier is removed from the silicon-based wafer by irradiating the UV tape with a UV light through the glass carrier. The silicon-based wafer is then flipped and placed onto a vacuum plate and secured to the vacuum plate by applying vacuum to the vacuum plate. The vacuum holder is then released from the silicon-based wafer leaving the silicon-based wafer secured to the vacuum plate for subsequent processing steps.

9 Claims, 6 Drawing Sheets

UV Light 30
20
10
106
100
102
104
108

16
10
100

FIXTURE FOR P-THROUGH SILICON VIA ASSEMBLY

CROSS-REFERENCE TO RELATED APPLICATIONS

None

FIELD OF THE INVENTION

This disclosure relates to semiconductor device package assembly technology.

BACKGROUND

One of the recent developments in microelectronics packaging technology is through-silicon-via (TSV) interposers that allow more dense packaging of device chips by allowing 3-dimensional chip stacking. Because the TSV interposers are very thin, however, handling of the TSV interposers during the chip assembly process is challenging. Often, TSV Interposers are made of silicon waters having a thickness of 90 µm.

Referring to FIG. 10, a TSV interposer wafer 10 can be made from silicon wafer with typically copper-based through vias 12 extending through the thickness of the silicon wafer 10. On one side of the silicon wafer 10, the TSVs terminate forming pads for receiving flip-chip bonding chips. On the opposite side of the silicon wafer, the TSVs are electrically connected to metalized pads 14 by appropriate thin film wiring and solder bumps 16 are formed on the metalized pads for next level interconnection.

TSV interposers are generally mounted on a glass carrier 20 on the solder bump side using a UV tape 30 for handling purposes. The glass carrier 20 provides rigidity to the otherwise very thin (about 90 µm-150 µm thick) fragile TSV interposers and allow safer handling of the TSV interposer. While the TSV interposer is attached to the glass carrier 20, the back-side 10B (side opposite from the glass carrier) is ground and chemically etched to expose copper posts for subsequent flip-chip bonding.

After the grinding and etching processes, the glass carrier 20 is removed by irradiating the UV tape through the glass carrier with UV light so that semiconductor chips can be flip-chip bonded to the back-side 10B of the TSV interposer. Generally, the TSV interposers are fabricated as an array of TSV interposers in a wafer form and a semiconductor chip configured for flip chip bonding is placed on each TSV interposer in the array. After the semiconductor chips are placed on the TSV interposers, the TSV interposer wafer goes through a flip-chip bonding reflow process to bond the semiconductor chips to the TSV interposers. After the glass carrier 20 is removed, however, because the TSV interposer is fragile, the subsequent flip-chip bonding process becomes difficult and many TSV interposers can be lost due to breakage.

SUMMARY

According to an embodiment, a method of handling a silicon-based wafer, such as a TSV interposer wafer for example, having a first and second surfaces wherein a glass carrier is mounted on the second surface of the TSV interposer by a UV tape is disclosed. The method comprises holding the silicon-based wafer by a vacuum holder applied on the first surface of the silicon-based wafer so that the glass carrier is oriented on top side. Next, the glass carrier is removed from the silicon-based wafer by irradiating the UV tape with a UV beam through the glass carrier. The UV irradiation causes the UV tape to lose its adhesive power. The silicon-based wafer is then flipped so that the vacuum holder is on the top side with the first surface of the silicon-based wafer now facing down. The silicon-based wafer is then placed onto a vacuum plate and secured to the vacuum plate by applying vacuum to the vacuum plate. Next, the vacuum holder is released from the silicon-based wafer leaving the silicon-based wafer on the vacuum plate. The vacuum plate holding the silicon-based wafer is then utilized to securely and safely carry the silicon-based wafer through various subsequent processing steps.

According to another embodiment, a method of packaging a semiconductor device is disclosed. The method comprises providing a silicon-based wafer having a first and a second surface, the silicon-based wafer being mounted to a glass carrier on the second surface by a UV tape. The silicon-based wafer is then held by a vacuum holder applied on the first surface of the silicon-based wafer. Next, the glass carrier is removed from the silicon-based wafer by irradiating the UV tape with a UV beam through the glass carrier which releases the UV tape. The silicon-based wafer is then flipped so that the second surface of the silicon-based wafer is facing up and placed onto a vacuum plate so that the vacuum plate contacts the second surface of the silicon-based wafer. The silicon-based wafer is secured to the vacuum plate by applying vacuum to the vacuum plate.

Once the silicon-based wafer is secured by the vacuum plate, the vacuum holder is released from the silicon-based wafer and removed thus exposing terminal ends of the TSVs on the second surface of the silicon-based wafer. One or more semiconductor chips are placed on the second surface of the silicon-based wafer and flip-chip bonded.

The innovative apparatus and method disclosed herein handle glass detachment from the through-silicon-vial interposer wafer without damage to the interposer wafer.

BRIEF DESCRIPTION OF THE DRAWINGS

The features shown in the above referenced drawings are illustrated schematically and are not intended to be drawn to scale nor are they intended to be shown in precise positional relationship. Like reference numbers indicate like elements.

DETAILED DESCRIPTION

Figure 1:
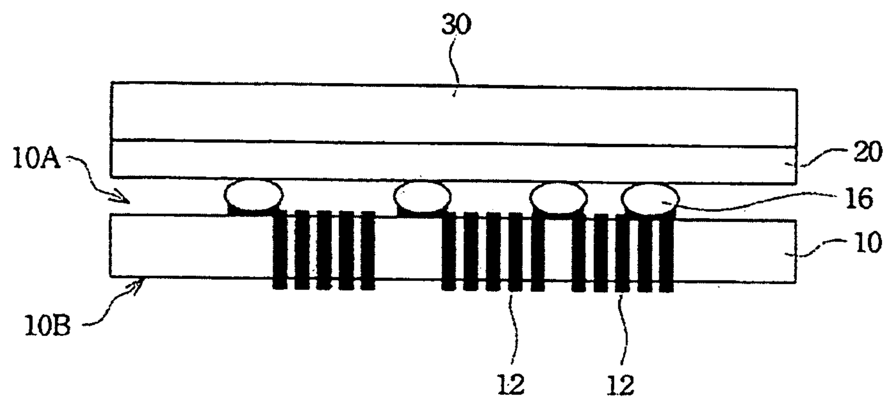
FIG. 1 is a cross-sectional illustration of a TSV interposer wafer mounted on a glass carrier.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

A method of handling a silicon-based wafer, such as a TSV interposer wafer for example, during an assembly process for packaging semiconductor devices is disclosed. FIG. 1 is a cross-sectional illustration showing an exemplary TSV interposer wafer 10 mounted on a glass carrier 20 by a UV tape 30. The TSV interposer wafer has a front-side surface 10A and a back-side surface 10B and comprises TSVs 12 and solder bumps 16. The glass carrier 20 is attached to the solder bumps 16 by the UV tape 30. The back-side surface 10B of the TSV interposer wafer 10 has been ground and etched to expose the terminal ends of the copper TSVs for subsequent, flip-chip bonding.

Figure 2:
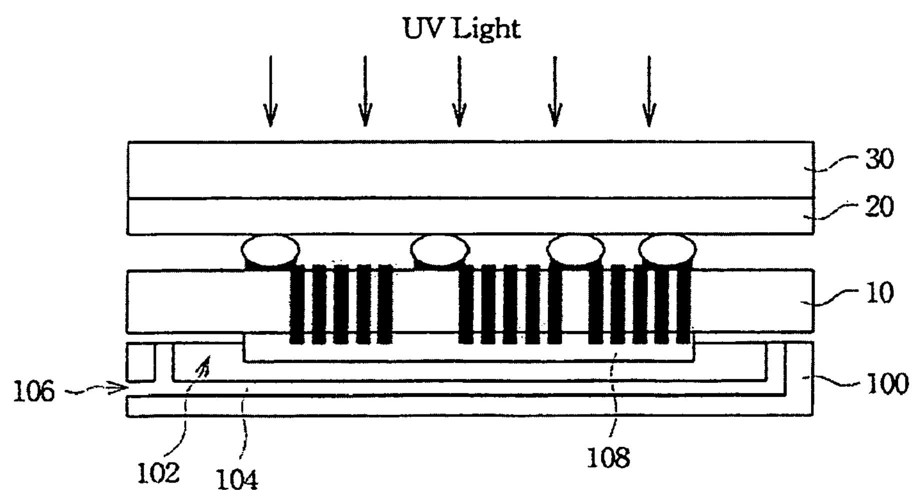
FIG. 2 is a cross-sectional illustration of the TSV interposer wafer of FIG. 1 being held by a vacuum holder.

After the grinding and etching of the back-side surface 10B, the TSV interposer with the glass carrier 20 attached is securely held by a vacuum holder 100 as shown in FIG. 2 for further handling. The vacuum holder 100 is provided with internal channels 104 for delivering vacuum to the contact surface 102 of the vacuum holder that contacts the TSV interposer wafer 10 for securely holding the TSV interposer wafer 10. The channels 104 are connected to one or more ports 106 for delivering vacuum. The vacuum holder 100 is configured and adapted to be connected to an appropriate vacuum source (not shown). The vacuum holder 100 can be provided with a recess 108 for accommodating the terminal ends of the TSVs 12 on the back-side 10B of the TSV interposer wafer 10 so that the terminal ends of the TSVs 12 do not get damaged.

Figure 3:
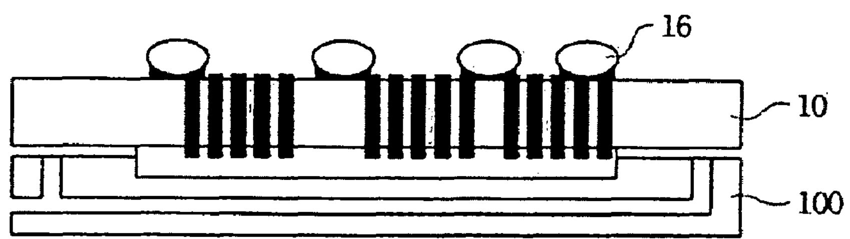
FIG. 3 is a cross-sectional illustration of the TSV interposer wafer of FIG. 2 with the glass carrier removed.

As shown in FIG. 2, the UV tape 30 is exposed to UV light radiation through the glass carrier 20 which diminishes the adhesive property of the UV tape 30 and the glass carrier 20 is removed. FIG. 3 shows the remaining TSV interposer wafer 10 attached to the vacuum holder 100.

Figure 4:
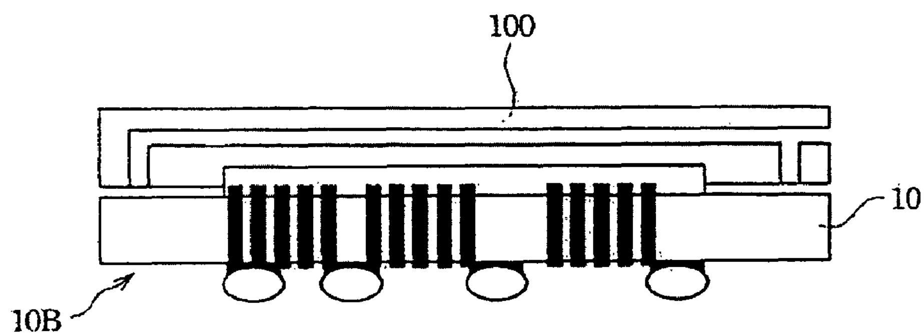
FIG. 4 is a cross-sectional illustration of the TSV interposer wafer of FIG. 3 after being flipped upside down.
Figure 5:
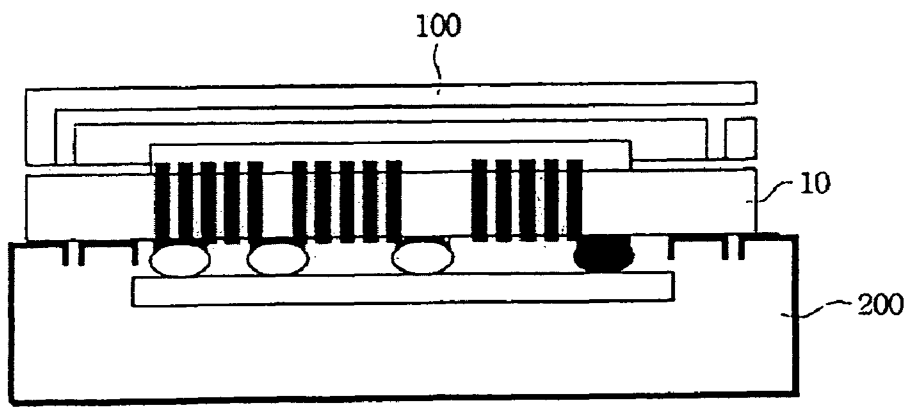
FIG. 5 is a cross-sectional illustration of the TSV interposer wafer of FIG. 4 placed onto a vacuum plate.

Next, the assembly shown in FIG. 3 is flipped upside down as shown in FIG. 4 and then mounted or placed on to a vacuum plate 200 as shown in FIG. 5. The TSV Interposer water is secured to the vacuum plate 200 by applying vacuum to the vacuum plate 200. The vacuum plate 200 comprises contact surfaces 202 that contacts the back-side surface 10B of the TSV interposer wafer 10. The vacuum plate 200 further comprises vacuum channels 202 that open at the contact surfaces 202 for delivering vacuum for securely holding the TSV interposer wafer 10 to the vacuum plate 200. The vacuum plate 200 can also comprise a support plate 210 for supporting the solder bumps 16. In a preferred embodiment, the support plate 210 is made of a material that can withstand solder reflow temperature of the subsequent flip-chip bonding process and not wettable to the solder comprising the solder bumps 16. One example of such support plate 210 is made of a polyimide.

Figure 6:
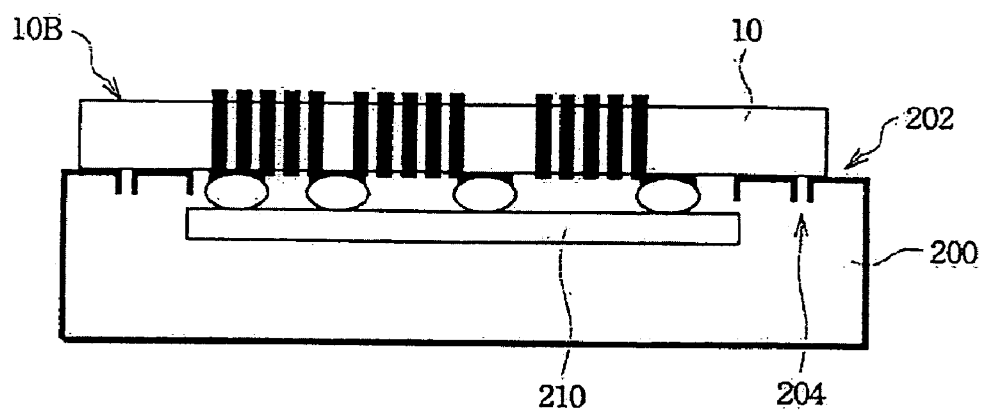
FIG. 6 is a cross-sectional illustration of the TSV interposer wafer of FIG. 5 after the vacuum holder is released from the TSV interposer wafer.

As shown in FIG. 6, once the TSV interposer wafer 10 is securely mounted to the vacuum plate 200, the vacuum holder 100 is released from the TSV interposer wafer 10 and removed, thus exposing terminal ends of the TSVs 12 on the front-side surface 10A of the TSV interposer wafer 10. According to the method of the present disclosure, the assembly of FIG. 6, including the vacuum plate 200 is used to handle the TSV interposer wafer 10 through a flip-chip bonding process.

Figure 7:
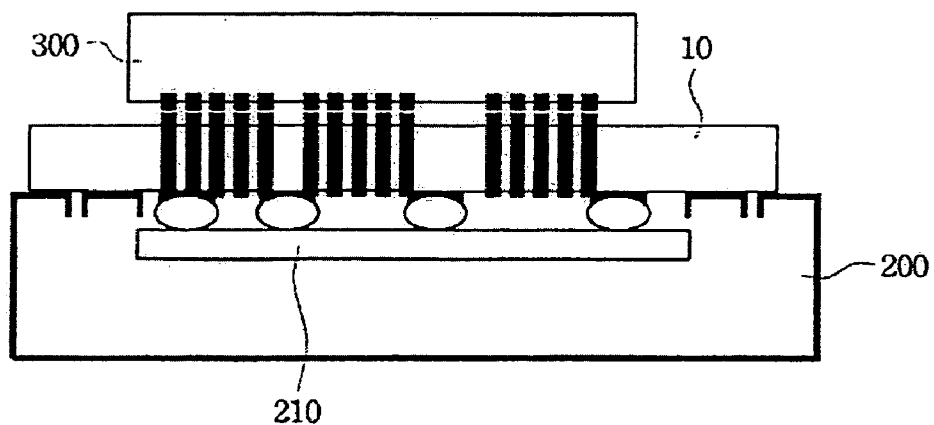
FIG. 7 is a cross-sectional illustration of the TSV interposer wafer/vacuum plate assembly of FIG. 6 with a semiconductor chip placed on the TSV interposer wafer.

Next, one or more flip-chip bonding semiconductor chips 300 are placed on the front-side surface 10A of the TSV interposer wafer 10 as shown in FIG. 7. The semiconductor chips 300 are provided with flip-chip bonding bumps/pads (typically formed of solder such as Pb/Sn solder) that aligns with the terminal ends of the TSVs 12 on the front-side surface 10A of the TSV interposer wafer 10. The assembly shown in FIG. 7, including the vacuum plate 200 is then sent through a flip-chip bonding reflow cycle to reflow the flip-chip bonding solder bumps/pads on the semiconductor chips 300. Thus, the vacuum plate 200 and its components such as the support plate 210 are made of materials that can withstand the flip-chip bonding reflow temperature.

Figure 8:
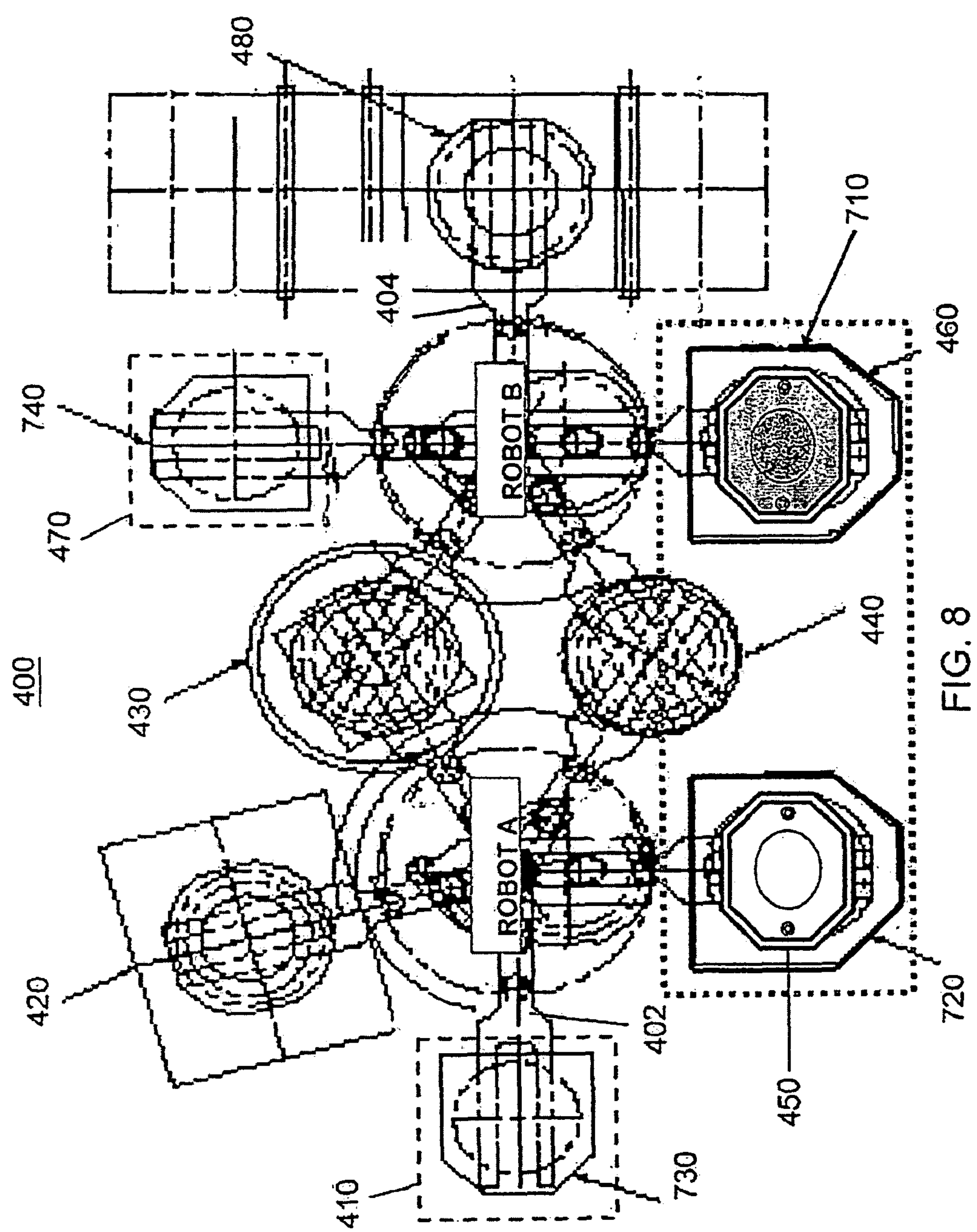
FIG. 8 is a plan view illustration view of an example of an automated robotic system for implementing the method of the present disclosure according to an embodiment.
Figure 9:
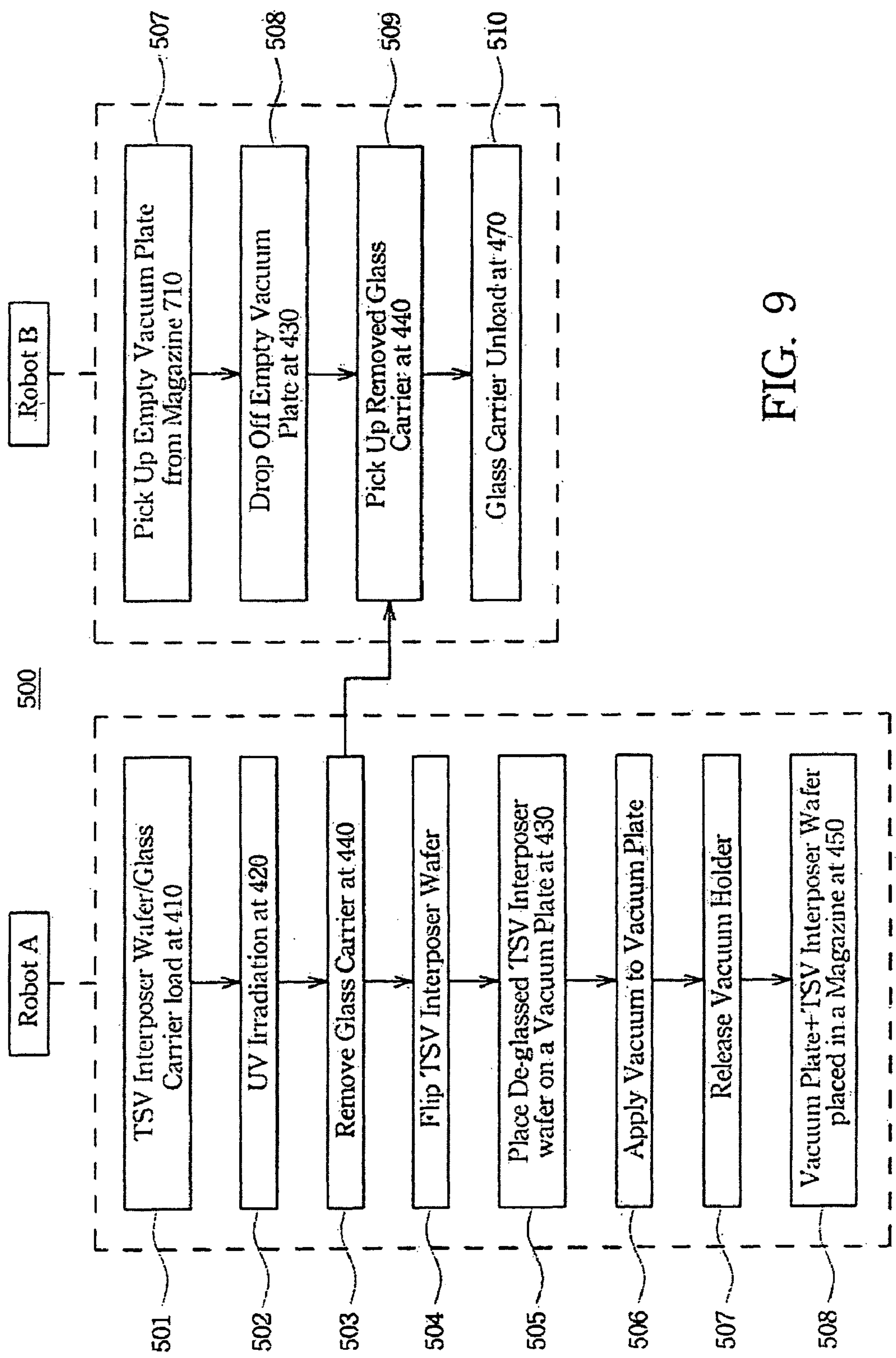
FIG. 9 is a flowchart diagram illustrating the method of the present disclosure according to an embodiment.
Figure 10:
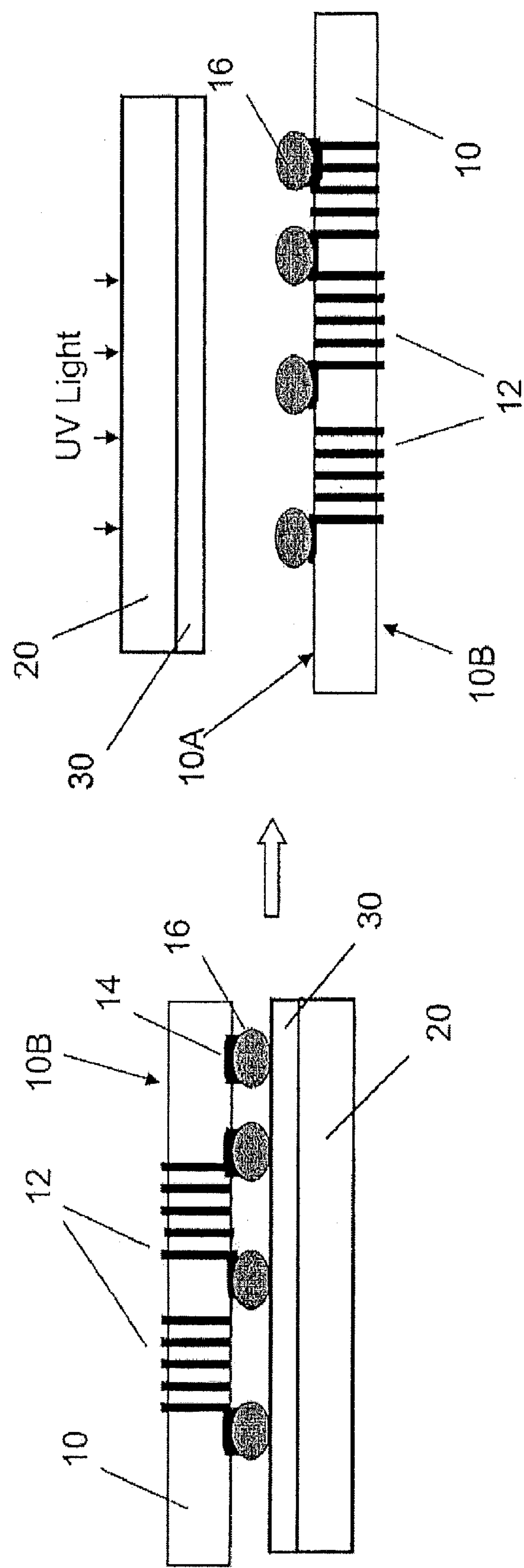
FIG. 10 is a cross-sectional illustration of a glass carrier attached to a TSV interposer by a UV tape being removed from the TSV interposer using UV light.

FIG. 8 is a schematic illustration of an automated robotic-system 400 that can be used to implement the method of the present disclosure. FIG. 9 is a flowchart 500 illustrating the method of the present disclosure illustrating how the automated robotic system of FIG. 8 can implement the method. The automated robotic system 400 comprises two robots Robot A and Robot B for picking up, transporting and unloading the TSV interposer wafer 10 assemblies. Each of the robots comprises an arm configured and adapted for picking up and unloading the TSV interposer wafer assemblies. Robot A comprises an arm 402 and the Robot B comprises an arm 404. Robot A and Robot B controllably swing the arms 402 and 404 about their centers and various processing stations and pick up, unloading stations are positioned about the Robot A and Robot B to carry out the method of the present disclosure.

For example, positioned around the Robot A are TSV interposer wafer loading station 410, UV irradiation station 420, TSV interposer wafer mounting station 430, glass carrier removal station 440 and a de-glassed TSV interposer wafer unloading station 450. Positioned around the Robot B are vacuum plate loading station 460, dicing tape/ring attachment station 480, glass carrier unloading station 470, TSV interposer wafer mounting station 430 and glass carrier removal station 440. As can be seen, the TSV interposer wafer mounting station 430 and the glass carrier removal, station 440 are positioned between Robot A and Robot B and accessible by both robots. At the dicing tape/ring attachment station 480 dicing tape is laminated on to the wafer and attached to a metal ring for wafer dicing.

Referring to the box 501 of the flowchart 500, Robot A picks up a TSV interposer wafer/glass carrier assembly at the TSV interposer wafer loading station 410. At the TSV interposer wafer loading station 410, a supply of TSV interposer wafers 10 with glass carriers 20 attached are provided in a magazine 730. Each magazine 730 generally can hold several of the TSV interposer wafers 10. Robot A's arm 402 is configured and adapted to operably hold the vacuum holder 100 for picking up the TSV interposer wafer/glass carrier assembly as shown in FIG. 2.

Referring to box 502, holding the TSV interposer wafer/glass carrier assembly by the vacuum holder 100, the Robot A then transfers the TSV interposer wafer/glass carrier assembly to the UV irradiation station 420 where UV irradiation releases the UV tape 30 that is holding the TSV interposer wafer 10 and the glass carrier 20 together.

Referring to box 503, the Robot A then transfers the TSV interposer wafer/glass carrier assembly to the glass carrier removal station 440 where the released glass carrier 20 is removed from the TSV interposer wafer 10. Then, Robot B picks up the removed glass carrier 20. (See box 509).

Referring to box 510, the Robot B transfers the removed glass carrier 20 to glass carrier unloading station 470 and disposes it in a magazine 740 provided in the glass carrier unloading station 470. When the magazine 740 gets full, an operator may replace the fully loaded magazine 740 with an empty one.

Referring to box 504, after the glass carrier 20 is removed from the TSV interposer wafer 10 at the glass carrier removal station 440, the Robot A still holding the TSV interposer wafer 10 via the vacuum holder 100, flips the TSV interposer wafer 10 upside down into the configuration shown in FIG. 4 so that the vacuum holder 100 is now facing up.

Referring to boxes 507 and 508, after disposing of the removed glass carrier 20 at the glass carrier unloading station 470, the Robot B picks up a vacuum plate 200 from the vacuum, plate loading station 460 and transfers it to the TSV interposer wafer mounting station 430 and drops it off. At the vacuum plate loading station 460, several vacuum plates 200 are provided in a magazine 710.

Referring to box 505, the Robot A transfers the flipped TSV interposer wafer 10 shown in FIG. 4 to the TSV interposer wafer mounting station 430, where the TSV interposer wafer is placed onto the vacuum plate 200 as shown in FIG. 5. The front-side surface 10A of the TSV interposer wafer 10 rests on the contacting surface 202 of the vacuum plate 200.

Referring to box 506, vacuum is applied to the vacuum plate 200 securely holding the TSV interposer wafer 10 to the vacuum plate. The Robot A is configured and adapted to provide a vacuum source for the vacuum plate 200.

Referring to box 507, next, the vacuum holder 100 is released from the back-side surface 10B of the TSV Interposer wafer 10.

Referring to box 508, the Robot A places the vacuum plate 280 with the TSV interposer wafer 10 secured thereon in a magazine 720 of the glass carrier unloading station 450.

The automated process described above is repeated until the magazine 720 is filled with desired number of TSV interposer wafers 10 secured onto their own vacuum plates 200. Typically, the magazine 720 can hold 10 to 15 vacuum plates 200 each having a TSV interposer wafer secured thereon. Once the magazine 720 is filled, an operator or an automated magazine carrier can transport the magazine 720 to a flip-chip bonding reflow station (not shown).

The automated TSV interposer wafer handling system and method described herein allows automated safe handling of thin TSV interposer wafers. Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method of handling a silicon-based wafer having a first and second surfaces wherein a glass carrier is mounted on the second surface of the silicon-based wafer by a UV tape, the method comprising:

holding the silicon-based wafer by a vacuum holder applied on the first surface of the silicon-based wafer;

removing said glass carrier from the silicon-based wafer by irradiating said UV tape with a UV beam through the glass carrier, thereby releasing the UV tape;

flipping the silicon-based wafer;

placing the silicon-based wafer onto a vacuum plate;

securing the silicon-based wafer on the vacuum plate by applying vacuum to the vacuum plate; and releasing the vacuum holder from the silicon-based wafer.

2. The method of claim 1, wherein the vacuum plate contacts the second surface of the silicon-based wafer.

3. The method of claim 2, wherein the vacuum plate directly contacts the second surface of the silicon-based wafer.

4. The method of claim 2, wherein the vacuum plate indirectly contacts the second surface of the silicon-based wafer.

5. The method of claim 1, wherein the silicon-based wafer has a thickness less than about 150 μm.

6. The method of claim 1, wherein the silicon-based wafer has a thickness less than about 90 μm.

7. A method of packaging a semiconductor device comprising:

providing a thin silicon-based wafer having a first and a second surface, said silicon-based wafer mounted to a glass carrier on the second surface by a UV tape;

holding the silicon-based wafer by a vacuum holder applied on the first surface of the silicon-based wafer;

removing said glass carrier from the silicon-based wafer by irradiating said UV tape with a UV beam through the glass carrier, thereby releasing the UV tape;

flipping the silicon-based wafer;

placing the silicon-based wafer onto a vacuum plate, said vacuum plate contacting the second surface of the silicon-based wafer;

securing the silicon-based wafer on the vacuum plate by applying vacuum to the vacuum plate;

releasing the vacuum holder from the silicon-based wafer; and flip-chip bonding one or more semiconductor devices to the silicon-based wafer on the first surface of the silicon-based wafer.

8. The method of claim 7, wherein the silicon-based wafer has a thickness less than about 150 μm.

9. The method of claim 7, wherein the silicon-based wafer has a thickness less than about 90 μm.

* * * * *